(12) United States Patent
Hillman et al.

(10) Patent No.: US 6,626,186 B1
(45) Date of Patent: Sep. 30, 2003

(54) METHOD FOR STABILIZING THE INTERNAL SURFACE OF A PECVD PROCESS CHAMBER

(75) Inventors: Joseph Hillman, Scottsdale, AZ (US); Steven Caliendo, Gold Canyon, AZ (US); Gerrit J. Leusink, Tempe, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/713,935

(22) Filed: Nov. 16, 2000

Related U.S. Application Data

(63) Continuation-in-part of application No. 09/063,196, filed on Apr. 20, 1998.

(51) Int. Cl.$^7$ ............................................. C23C 16/08
(52) U.S. Cl. ..................... 134/1.1; 134/22.1; 427/535; 427/576; 427/253
(58) Field of Search .................. 427/535, 576, 427/253; 134/1.1, 22.1

(56) References Cited

FOREIGN PATENT DOCUMENTS

WO          99/54522         * 10/1999

* cited by examiner

Primary Examiner—Timothy Meeks
(74) Attorney, Agent, or Firm—Wood, Herron & Evans, LLP

(57) ABSTRACT

Apparatus and method of processing a substrate comprises positioning a substrate within a processing space of a processing chamber, and depositing a material layer, such as a titanium-containing layer, onto the substrate using plasma-enhanced chemical vapor deposition. The substrate is then removed from the processing chamber and the processing space is purged. A gas mixture containing oxygen is then introduced into the processing space and the gas mixture is excited with RF energy to form an oxygen-containing plasma. The oxygen-containing plasma is sustained for a predetermined amount of time in the processing space.

5 Claims, 6 Drawing Sheets

METHOD FOR STABILIZING THE INTERNAL SURFACE OF A PECVD PROCESS CHAMBER

RELATED APPLICATIONS

This application is a continuation-in-part of U.S. patent application Ser. No. 09/063,196, filed Apr. 20, 1998 and entitled "Method of Passivating and Stabilizing a TiPECVD/TiN-CVD Process Chamber and Combined Ti-PECVD/TiN-CVD Processing Method and Apparatus."

FIELD OF THE INVENTION

This invention relates generally to plasma-enhanced chemical vapor deposition (PECVD) for applying a coating on a substrate, and more specifically to a method for stabilizing the internal surface of a PECVD process chamber using a plasma.

BACKGROUND OF THE INVENTION

In the formation of integrated circuits (IC's), thin coatings or films containing metal and metalloid elements are often deposited upon the surface of a substrate, such as a semiconductor wafer. Such thin films are deposited to provide conductive and ohmic contacts in the circuits formed on the substrate and between the various components of an IC. For example, a conductive thin film might be applied to the exposed surface of a contact or via hole on a semiconductor wafer, with the film passing through the insulative layers on the wafer, to provide plugs of conductive material for the purpose of making electrical interconnections across the insulating layers.

One well known process for depositing thin metal films is chemical vapor deposition (CVD), in which a thin film is deposited as a result of chemical reactions between various deposition or reactant gases at the surface of the substrate. In CVD, reactant gases are pumped into proximity with a substrate inside a reaction chamber. The reactant gases subsequently react at the substrate surface, resulting in one or more reaction by-products which form a film on the substrate surface. Any by-products remaining in the chamber after the deposition are removed from the chamber.

One variation of the CVD process which is widely utilized is a plasma-enhanced CVD process or PECVD process, in which one or more of the reactant gases is ionized into a gas plasma to provide energy to the reaction process. PECVD may be desirable, for example, for lowering the temperatures which are usually necessary for a proper chemical reaction with standard CVD. In PECVD, electrical energy is delivered to the reactant gas or gases to form and sustain the plasma. For one such PECVD process, the susceptor or support containing the substrate and a planar element in the processing space, such as a planar gas supply element, are electrically biased to operate as opposing RF electrodes for energizing one or more of the reactant gases into an ionized plasma. Such a method is commonly referred to as a parallel plate method because the susceptor and the biased planar element are maintained generally parallel to one another to simulate biased electrical plates with the substrate positioned therebetween and generally parallel to the biased elements.

The reactant gases for CVD and PECVD processes are delivered to the processing space and substrate through a gas delivery system which provides the proper flow and distribution of the gases for the CVD process. Generally, such gas delivery systems contain gas-dispersing elements in the reaction chamber, such as gas injector rings or flat showerheads, which spread the entering reactant gases around the processing space to insure a uniform distribution and flow of the gases proximate the substrate. Uniform gas distribution and flow is desirable for a uniform and efficient deposition process, a dense plasma, and a uniformly deposited film.

One notable PECVD method involves the deposition of thin films of titanium and titanium-containing layers onto silicon substrates. Generally, for such a method, a plasma comprising $TiCl_4$, $H_2$, and Ar is utilized. Such a deposition process is described in U.S. Pat. Nos. 5,628,829; 5,665,640; 5,567,243; and 5,716,870, which patents are incorporated herein by reference in their entirety. During the deposition process, $TiCl_4$, which is partially reactive, condenses onto the walls of the processing chamber. The partially reacted $TiCl_4$ may be $TiCl_2$ or $TiCl_3$ or hydrogenated versions of these, such as $H_2TiCl_2$ or $HTiCl_3$. The condensation generally occurs due to the relatively low temperature of the chamber walls with respect to the susceptor and substrate.

Specifically, the susceptor and substrate are maintained at a temperature in the range of about 400° C. or above, and usually around 600° C. Such a processing temperature supports a complete reduction of the $TiCl_4$ gas and the subsequent deposition of titanium metal. However, the processing chamber internal walls are generally not as hot as the substrate and may be maintained at a temperature in the range of 80–200° C., and usually around 175° C. The wall temperature does not support complete decomposition of the $TiCl_4$, and thus, titanium sub-chlorides ($TiCl_x$ where x<4) are deposited onto the wall surfaces due to their low vapor pressure.

Such sub-chlorides are deposited onto the internal chamber walls as a powder, and they remain in the powder form as long as the processing chamber remains under vacuum pressure. The sub-chloride powder tends to become oily when the processing space inside of the chamber is exposed to atmosphere. This is generally due to moisture absorption, because the powder has a hygroscopic nature. An analysis of the powder has shown that it generally contains a mixture of $TiCl_2$ and $TiCl_3$.

Two specific problems are caused by the deposition on the reaction chamber walls. First, the deposition actually adheres very poorly to the walls. This leads to flaking of the residue from the walls and subsequent particle contamination on the substrate. The powder generally cannot be removed by conventional dry etching techniques (with the exception of $ClF_3$). Therefore, the processing chamber generally must be opened approximately every 200 deposition cycles for manual cleaning of the powder.

A second problem is that the deposited powder consists largely of titanium sub-chlorides, which have a high vapor pressure relative to the deposition pressure. Therefore, some of the sub-chlorides are volatilized during the deposition process. This volatilized material then diffuses to the substrate, and participates in the film deposition reaction. It has been observed that, for deposition onto silicon substrates, where the product of the deposition reaction is a titanium silicide film, the sub-chlorides from the processing chamber wall lead to a net increase in the amount of film deposited. Therefore, the deposition of the film is somewhat uncontrolled, which is an undesirable characteristic. Using $TiCl_2$ as an example, the following reaction occurs:

$$TiCl_2 + 2H \rightarrow 2<Ti_{(s)} + 2HCl$$

The deposited titanium quickly reacts with the underlying silicon from the substrate to form titanium silicide, albeit in a somewhat uncontrolled fashion.

In order to overcome the effects of the powder residue on the chamber walls, an ammonia plasma treatment has been devised. This treatment is described in greater detail in U.S. Pat. No. 5,593,511 which is incorporated herein by reference in its entirety. The treatment stabilizes the titanium sub-chlorides by reacting them with ammonia and converting them to titanium nitride. The titanium nitride forms as an adherent film on the processing chamber wall. It does not cause particle contamination problems and does not contribute to the film deposition reaction on the substrate. However, it does cause other problems, and thus there is still a need for a suitable solution to address the problems associated with the deposition of titanium sub-chlorides in the processing chamber.

The specific problem involving titanium nitride is that the film forms on the process chamber wall and also on the electrical insulator which isolates the RF electrode from the reaction chamber walls. The effect is to create a conducting path from the RF electrode to the grounded reaction chamber walls. This problem is described in U.S. patent application Ser. No. 09/153,128, filed Sep. 15, 1998, entitled "Apparatus and Method for Electrically Isolating an Electrode in a PECVD Process Chamber," which describes the use of serrations in the insulator to increase the length of the path to ground. Although this method is effective, it only increases the time until a short circuit may occur due to the titanium nitride buildup.

Therefore, it is desirable to reduce the effect of the titanium sub-chlorides altogether. To that end, it is one objective of the present invention to reduce, and possibly eliminate, the buildup of titanium sub-chlorides on the processing chamber wall. The invention will become more readily apparent from the Detailed Description and further disclosure below.

SUMMARY OF THE INVENTION

The present invention utilizes a method which stabilizes the internal surface of a PECVD process chamber, provides a more stabilized deposition process, yields a cleaner chamber, and reduces the possibility of a biased showerhead shorting to ground, such as through the process chamber.

The invention comprises a process including the steps of positioning a substrate within the processing space of a processing chamber and depositing a material layer on the substrate using plasma enhanced chemical vapor deposition. In one embodiment of the invention, titanium reactant gas is utilized and a titanium-containing layer is deposited onto a substrate. After deposition, the substrate is removed from the processing chamber and the processing space is purged, such as with a hydrogen/argon mixture. The purging step may be repeated several times. Thereafter, a gas mixture is introduced into the processing space. The gas mixture contains oxygen, and in one embodiment, the mixture is an oxygen/argon mixture. For example, the mixture might be 5% oxygen and 95% argon. However, other mixtures including a greater or lesser percentage of oxygen would be useful as well in the present invention.

RF energy is coupled to the processing chamber to excite or maintain an oxygen-containing plasma created from the gas mixture. The oxygen-containing plasma is sustained for a predetermined amount of time within the processing space. For example, a 60 second oxygen-containing plasma has been shown to be useful in achieving results with the present invention. In one aspect of the present invention, the oxygen-containing plasma might be followed by an argon/hydrogen purge of the processing space.

BRIEF DESCRIPTION OF THE DRAWINGS

The accompanying drawings, which are incorporated in and constitute a part of this specification, illustrate embodiments of the invention and, together with a general description of the invention given below, serve to explain the principles of the invention.

DETAILED DESCRIPTION OF THE EMBODIMENTS

Figure 1:
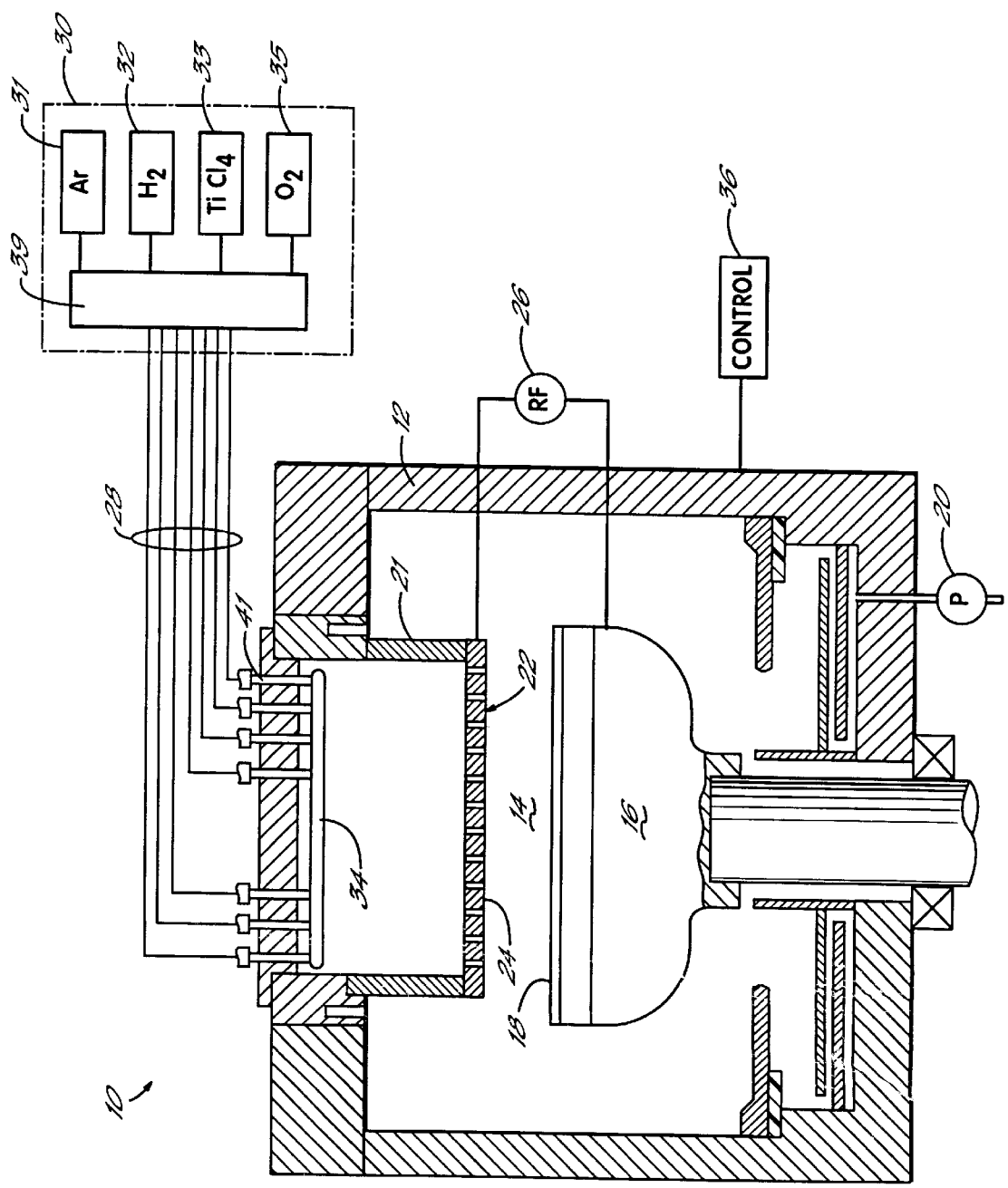
FIG. 1 is an elevational cross-sectional view of a processing system in accordance with the principles of the present invention.

FIG. 1 is an elevational cross sectional view of one suitable CVD processing system for practicing the present invention. Processing system 10 includes a processing chamber 12 formed of a suitable material such as stainless steel, which defines a processing space 14 therein. A substrate support or susceptor 16, which may be rotating or stationary, supports a substrate 18 within the processing space 14 to receive a material layer or film through CVD and/or PECVD processes. Processing chamber 12 will further comprise other systems, such as a vacuum system including at least one pump 20 for providing a vacuum pressure within processing space 14, which is generally necessary for PECVD processes. A manifold or showerhead 22 is illustrated supported around its peripheral edges by an insulative support 21 such that the bottom face surface 24 of the showerhead 22 faces into the processing space 14 toward substrate 18. Insulative support 21 insulates the RF biased showerhead 22 from the electrically grounded chamber 12. In a preferred embodiment, showerhead 22 is generally parallel to substrate 18, which is desired for RF parallel plate PECVD processes. An RF power supply 26 is coupled to the susceptor and showerhead for biasing those elements according to well known PECVD principles. For PECVD 10 processes, showerhead 22 may be coupled through an appropriately constructed RF shaft or line (not shown) to RF energy supply 26 for biasing the showerhead and creating a plasma within processing space 14 for plasma-enhanced deposition of PECVD, as understood by a person of ordinary skill in the art.

In accordance with the principles of the present invention, separate reactant gases are provided to showerhead 22 by gas delivery system 28 and supplies 30, respectively. Certain gases are shown as part of supply 30. However, as will be understood by a person of ordinary skill in the art, the present invention might be utilized for introducing other types of reactant gases through showerhead 22. The gas delivery system might include one or more rings 34 to direct gas to the showerhead 22 in a uniform manner. Chamber 12 and the processing system 10 will also include an appropriate control system 36 for controlling all of the various sub-systems of the processing system 10, in accordance with the principles of the invention. As will be understood, system 10 may include other subsystems, not shown, for processing a substrate.

The present invention is directed to ensuring uniformly controlled PECVD of titanium and the prevention of the biased showerhead electrode being shorted to ground. Specifically, a unique combination of process steps is utilized in combination with a deposition process for addressing the coating of titanium sub-chlorides throughout the processing space of a processing chamber and specifically, the coating of titanium sub-chloride on processing chamber walls.

Figure 2:
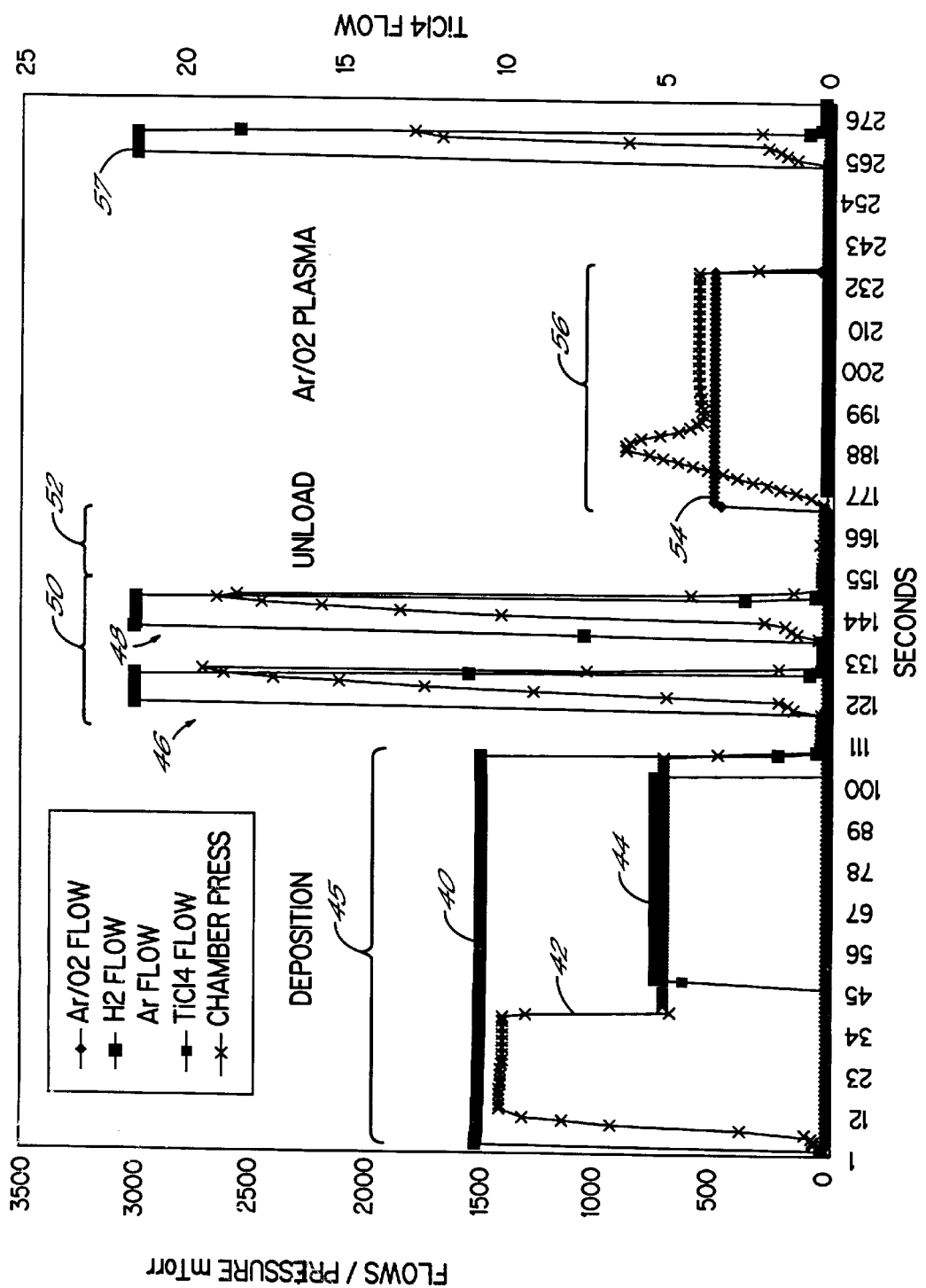
FIG. 2 is a graph of various gases and pressures over time for the inventive process.

Referring to FIG. 2, a process is illustrated in accordance with one embodiment of the present invention. For PECVD of titanium, a flow of hydrogen and argon is first initiated, as illustrated by reference numeral 40. The chamber pressure, indicated by reference numeral 42, is then dropped, and a plasma is initiated. A flow of TiCl$_4$ is initiated, as indicated by reference numeral 44, simultaneously with the H$_2$, Argon flow and the plasma. Within the zone defined by reference numeral 45 in FIG. 2, deposition of titanium occurs on a substrate according to the reaction discussed above. Thereafter, the flow of hydrogen and argon and the TiCl$_4$ is stopped at the end of the deposition process.

Thereafter, as indicated by reference numerals 46 and 48, the processing chamber 12 is purged with a mixture of hydrogen and argon. A first purge occurs, then the processing chamber is pumped down to a base pressure and the purge is repeated, as indicated by reference numeral 48. The overall pump/purge zone is indicated generally by reference numeral 50. Thereafter, in the indicated by reference numeral zone 52, the substrate is unloaded from the processing chamber. The processing chamber 12 is again pumped down to a base pressure and, as indicated at reference numeral 54, a gas mixture containing oxygen is directed into the processing space of the chamber. Specifically, an oxygen (O$_2$) and argon (Ar) mixture is utilized in accordance with one embodiment of the invention. In a suitable mixture, the mixture is approximately 5% oxygen and 95% argon. The pressure is increased to approximately 500 mTorr.

An RF plasma from RF power supply 26 at approximately 250 Watts at 450 KHz is then established in the chamber. In the embodiment illustrated in FIG. 2, the oxygen plasma treatment time is in the range of approximately 60 seconds, as indicated by zone 56. Thereafter, the processing chamber is again brought down to base pressure and is purged with a hydrogen/argon mixture illustrated by reference numeral 57. While the embodiment disclosed herein utilizes an oxygen/argon mixture which is 5% oxygen, other mixture percentages would be suitable, in accordance with the principles of the present invention. Furthermore, another inert gas other than argon might also be utilized within such an oxygen mixture.

Referring to FIG. 1, supply 30 includes a supply 31 of argon, hydrogen 32, a supply 33 of TiCl$_4$, and a supply 35 of oxygen, which are directed through appropriate valves 39, 41 and gas lines associated with gas delivery system 28. The gases are distributed evenly through the processing chamber due to the operation of the showerhead 22 and gas ring(s) 34.

A specific discovery by the inventors, was that the oxygen plasma step of the invention leaves the inside of the reaction chamber very clean, and generally free of significant deposition. The exposure of the titanium sub-chlorides on the processing chamber wall to the plasma which contains oxygen forms a volatile titanium oxychloride (TiO$_x$Cl$_y$) by-product. The general reaction can be expressed as follows:

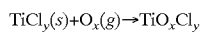
$$TiCl_y(s) + O_x(g) \rightarrow TiO_xCl_y$$

The volatile reaction by-product may then be pumped away by the vacuum system and pump 20. Furthermore, to some extent, the oxygen plasma also reacts with the titanium sub-chlorides on the reaction chamber wall to create a non-conducting layer of titanium oxide. Therefore, the formation of a conducting titanium nitride (TiN) layer on the insulative support 21, which would eventually cause a short circuit, is reduced and/or prevented. The present invention provided desirable results in several different ways. First, the deposition and resulting thickness of the film on the substrates is more controlled and relatively stable over the processing of multiple wafers.

Figure 3:
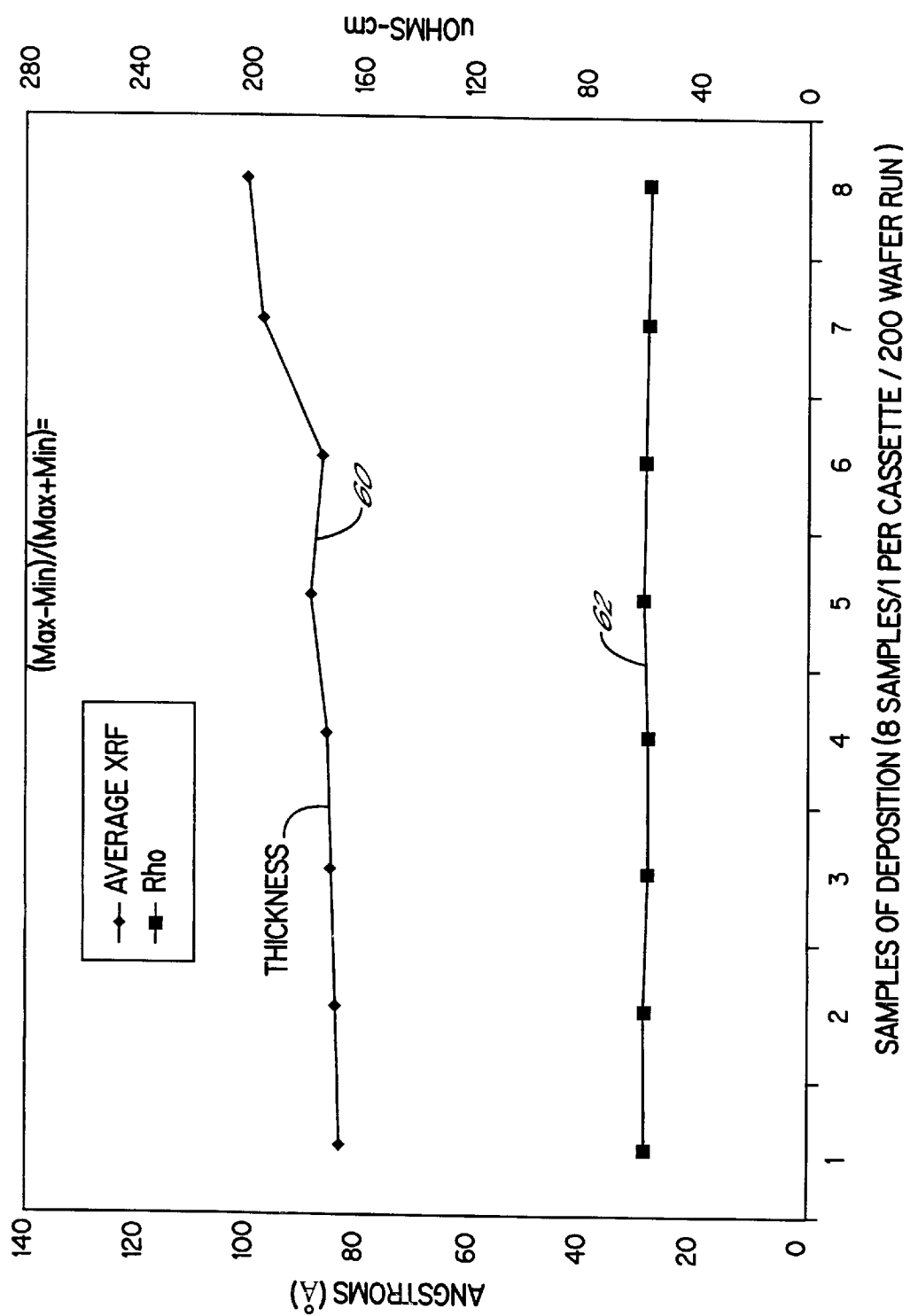
FIG. 3 is a graph of layer thickness and resistivity for various samples of substrates coated according to the principles of the present invention.
Figure 4:
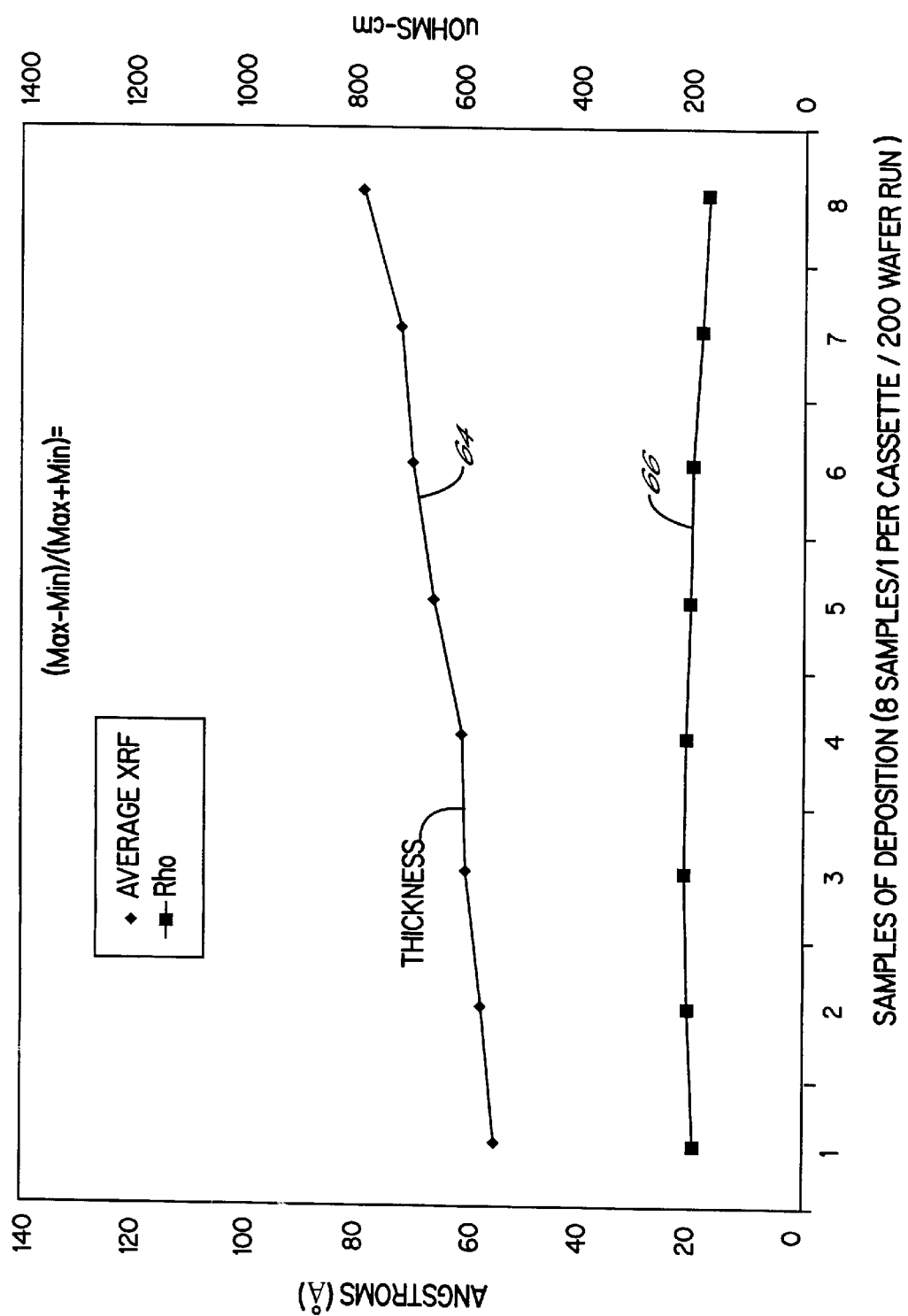
FIG. 4 is another graph of deposition thickness and resistivity, as shown in FIG. 3, for additional samples.

Referring to FIG. 3, deposition and resistivity characteristics are shown graphed over a sample of 8 substrates within a 200 substrate run (e.g. every 25$^{th}$ substrate was measured). The deposition thickness in angstroms (Å) is indicated by reference numeral 60, wherein resistivity in $\mu$Ohms-cm is indicated by reference numeral 62. The samples reflect a process where the formation of titanium nitride occurs on the processing chamber walls and showerhead support. FIG. 4 also illustrates deposition thickness 64 and resistivity 66 for 8 samples within a 200 wafer run wherein titanium nitride is formed on the walls of the processing chamber, and on the insulative showerhead support 21. As illustrated in the plots 60 and 64, the deposited film thickness shows a distinct increasing trend in subsequent samples. Such a trend indicates that the plasma conditions inside of the processing chamber are changing for subsequent samples as the conductive TiN filmed is formed on the insulative support 21 within the chamber. That is, the deposition rates are not as consistent as the number of samples progresses.

Figure 5:
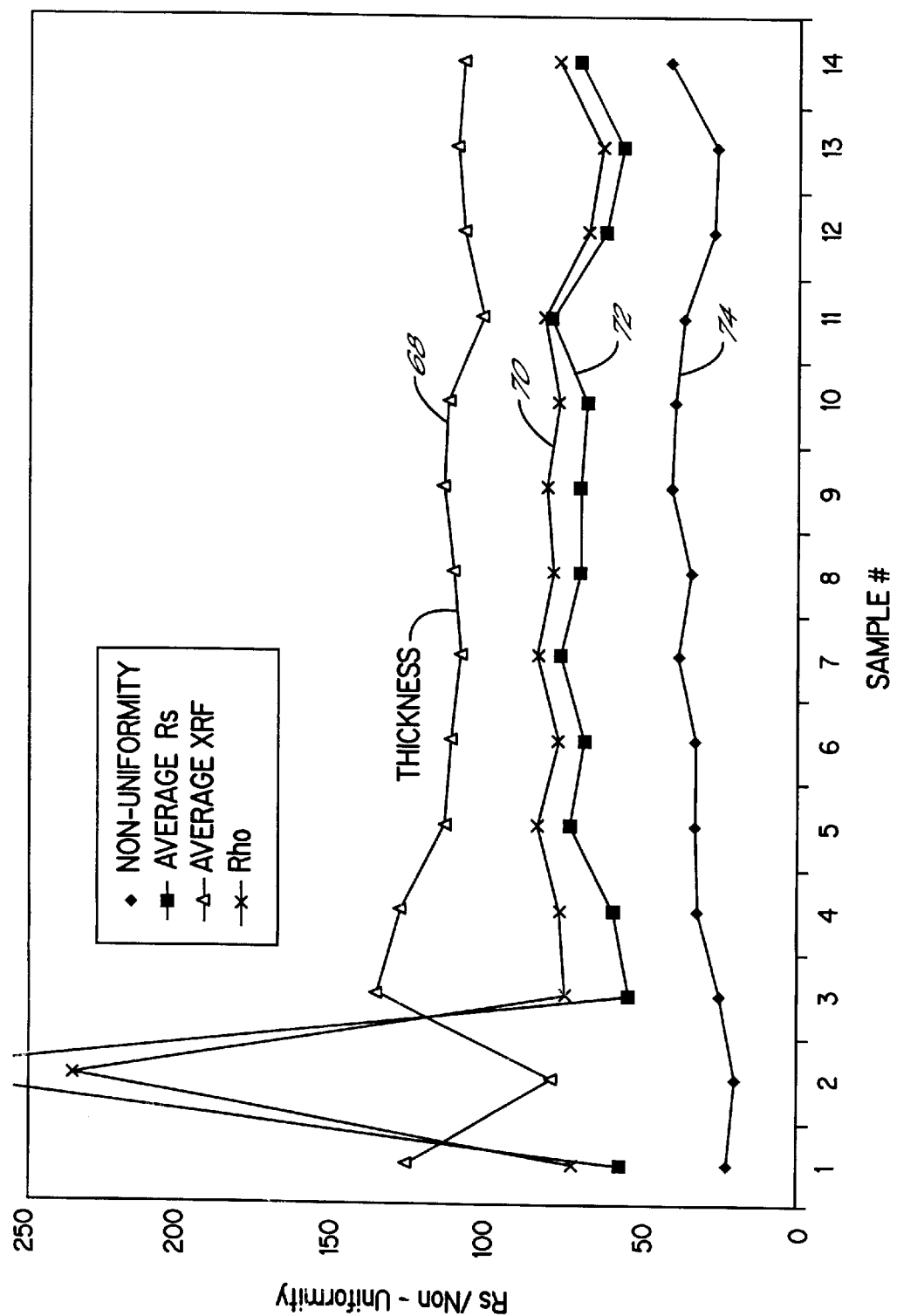
FIG. 5 is a graph of various characteristics of additional samples of substrates coated in accordance with the principles of the present invention.
Figure 6:
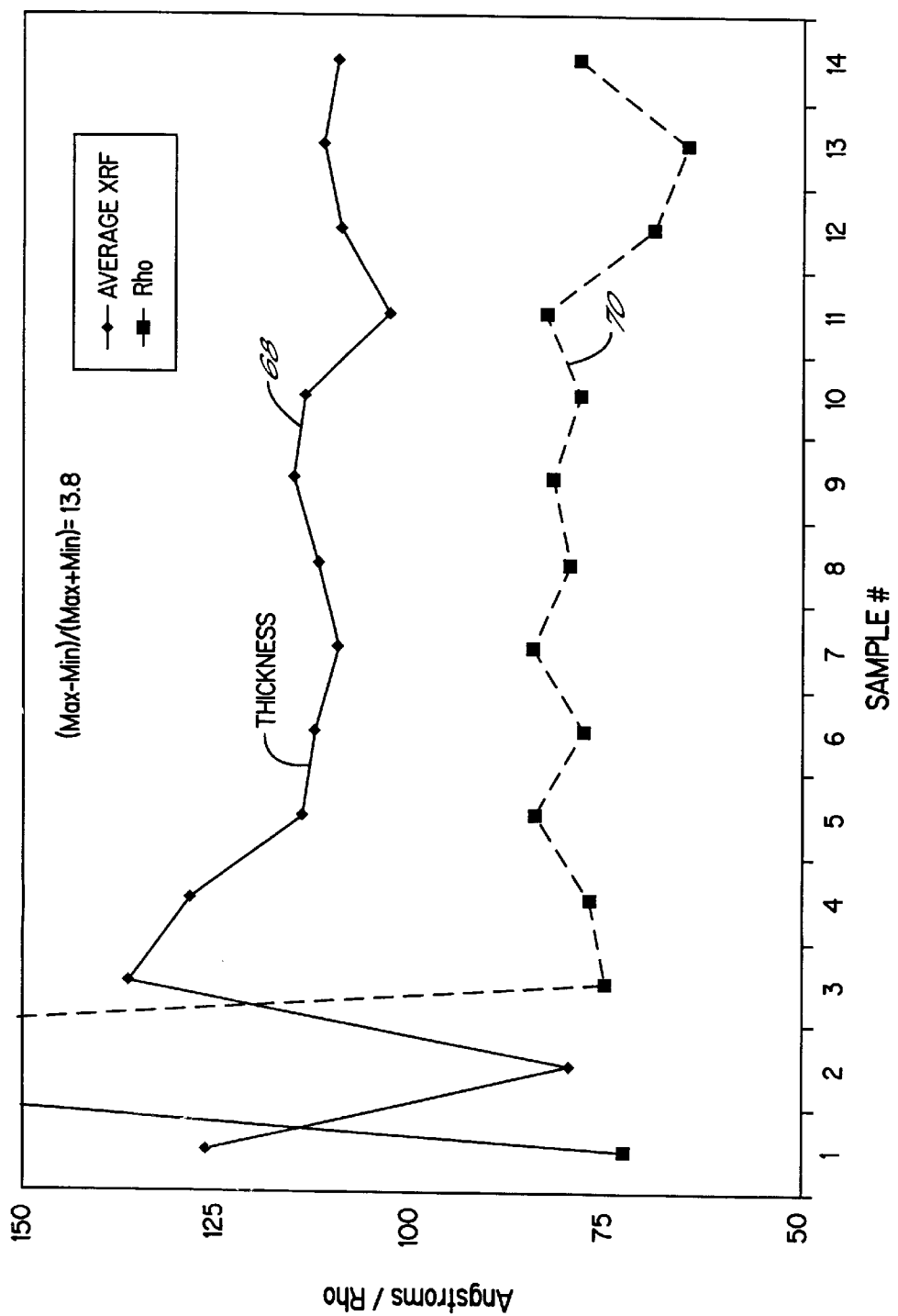
FIG. 6 is a graph similar to FIG. 5 for selected characteristics of sample substrates.

FIGS. 5 and 6 illustrate graphs of thickness and resistivity for a series of substrate samples which were coated in a process using the oxygen-containing plasma of the present invention between each sample. While there was an unexplained aberration in the data for the second substrate sample, the titanium deposition thickness as indicated by plot 68, is relatively stable over the various samples and does not show an increasing trend for each subsequent sample. FIG. 5 illustrates plots of average deposition thickness 68, resistivity 70, average sheet resistance 72, and non-uniformity 74, which is the standard deviation of resistivity as measured at 49 points around a substrate by a four-point probe.

FIG. 6 illustrates average deposition thickness and resistivity for the various samples as illustrated in FIG. 5 on a more expanded scale on the Y-axis. FIGS. 3, 4, 5, and 6 illustrate that greater stability in the thickness of the material deposited onto a substrate is obtained utilizing the present invention, rather than a technique wherein titanium nitride is formed within the processing space.

Further observation of sample processes indicated an additional advantage of the present invention as evidenced by a visual inspection of the inside wall of the processing chamber. Two hundred substrate samples were run when an ammonia plasma was utilized to form titanium nitride and another 200 substrate samples were run utilizing the oxygen plasma in accordance with the principles of the present invention. When utilizing an ammonia plasma for titanium nitride, the showerhead electrode 22 and the susceptor 16 exhibited a golden TiN deposition. The TiN film extended onto the insulative support 21 thereby forming a conductive layer on the insulative support, as discussed above. The inside walls of the processing chamber 12 were covered and discolored by a bluish film which was predominantly TiN.

Alternatively, following the 200 runs utilizing an oxygen-containing plasma in accordance with the principles of the present invention, the inside of the reaction chamber, including the walls thereof and various components therein, were significantly cleaner. There was no significant change to the insulative support 21, although the walls of that support were coated with a thin white film. An additional observation distinguishing the present invention from a method utilizing an ammonia plasma to form titanium nitride was an electrical difference between various films formed in each process. Resistance measurements were made on the films that had been formed on the insulative support 21. When utilizing an ammonia plasma, a golden TiN film was formed on the insulative support and the resistance was found to be less than approximately 1 Ohm. However, when an oxygen-containing plasma was utilized in accordance with the principles of the present invention, the measured resistance of the film was always greater than 4000 Ohms.

Accordingly, the present invention provides significant advantages in creating a more stable deposition process while maintaining a cleaner processing chamber. The reduction of TiN film buildup within the processing chamber further reduces the probability of contamination based upon particles from the TiN film flaking from the processing chamber wall and other covered components, such as the insulative support 21. Furthermore, the reduction of the buildup of a conductive TiN film on the insulative support 21 reduces the probability of the RF biased showerhead 22 shorting to the grounded chamber 12.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A method of reducing the effects of titanium sub-chlorides in the processing of a substrate to form a titanium-containing film comprising:

a) positioning a substrate within a processing space of a processing chamber;

b) depositing a material layer including titanium onto the substrate and the processing chamber using plasma enhanced chemical vapor deposition;

c) removing the substrate from the processing chamber and purging the processing space;

d) introducing a gas mixture containing oxygen into the processing space;

e) exciting the gas mixture with RF energy to form an oxygen-containing plasma;

f) sustaining the oxygen-containing plasma for a predetermined amount of time in the processing space to form a gaseous volatile titanium oxychloride by-product with titanium-containing material layer on the processing chamber;

g) pumping the gaseous volatile by-product from the processing chamber to significantly reduce the deposition of titanium sub-chlorides in the chamber.

2. The method of claim 1 wherein said gas mixture contains oxygen and argon.

3. The method of claim 2 wherein said mixture is approximately 95% argon and approximately 5% oxygen.

4. The method of claim 1 wherein said processing space is purged with a mixture of hydrogen and argon.

5. The method of claim 1 further comprising reacting titanium sub-chlorides in the processing chamber with oxygen from the oxygen-containing plasma to form titanium oxide.

* * * * *